United States Patent
Shi et al.

(10) Patent No.: US 10,804,199 B2
(45) Date of Patent: Oct. 13, 2020

(54) SELF-ALIGNED CHAMFERLESS INTERCONNECT STRUCTURES OF SEMICONDUCTOR DEVICES

(71) Applicant: GLOBALFOUNDRIES INC., Grand Cayman (KY)

(72) Inventors: Yongjun Shi, Clifton Park, NY (US); Ruilong Xie, Schenectady, NY (US); Nan Fu, Ballston Lake, NY (US); Chun Yu Wong, Clifton Park, NY (US)

(73) Assignee: GLOBALFOUNDRIES Inc., Grand Caymand (KY)

( * ) Notice: Subject to any disclaimer, the term of this patent is extended or adjusted under 35 U.S.C. 154(b) by 0 days.

(21) Appl. No.: 16/140,545

(22) Filed: Sep. 25, 2018

(65) Prior Publication Data

US 2020/0098688 A1    Mar. 26, 2020

(51) Int. Cl.
| | |
|---|---|
| H01L 23/528 | (2006.01) |
| H01L 21/768 | (2006.01) |
| H01L 21/027 | (2006.01) |
| H01L 23/532 | (2006.01) |
| H01L 21/285 | (2006.01) |
| H01L 23/522 | (2006.01) |
| H01L 21/321 | (2006.01) |
| H01L 21/3105 | (2006.01) |

(52) U.S. Cl.
CPC ...... *H01L 23/5283* (2013.01); *H01L 21/0273* (2013.01); *H01L 21/28568* (2013.01); *H01L 21/76802* (2013.01); *H01L 21/76843* (2013.01); *H01L 21/76877* (2013.01); *H01L 21/76897* (2013.01); *H01L 23/5226* (2013.01); *H01L 23/53238* (2013.01); *H01L 23/53252* (2013.01); *H01L 21/31053* (2013.01); *H01L 21/3212* (2013.01); *H01L 21/7684* (2013.01); *H01L 21/76819* (2013.01)

(58) Field of Classification Search
CPC .................. H01L 23/5283; H01L 23/5226
See application file for complete search history.

(56) References Cited

U.S. PATENT DOCUMENTS

| | | |
|---|---|---|
| 5,614,765 A | 3/1997 | Avanzino et al. |
| 2013/0328208 A1 | 12/2013 | Holmes et al. |
| 2015/0228585 A1 | 8/2015 | He et al. |
| 2016/0049330 A1* | 2/2016 | Peng .................. H01L 23/5226 257/774 |
| 2018/0286811 A1* | 10/2018 | Chang .................. H01L 29/456 |
| 2019/0164887 A1* | 5/2019 | Wang ................ H01L 21/76802 |
| 2019/0181088 A1* | 6/2019 | Lee .................... H01L 21/76831 |

OTHER PUBLICATIONS

Jun-Fei Zheng et al., Selective Co Growth on Cu for Void-Free Via Fill, 2015 IEEE International Interconnect Technology Conference and 2015 IEEE Materials for Advanced Metallization Conference (IITC/MAM), Nov. 12, 2015, 265-268, IEEE, Grenoble, France.

* cited by examiner

Primary Examiner — Quoc D Hoang
(74) Attorney, Agent, or Firm — David Cain

(57) ABSTRACT

A method of fabricating interconnects in a semiconductor device is provided, which includes forming an interconnect layer with a plurality of first conductive lines formed of a first conductive material in a dielectric layer. At least one via opening is formed over the plurality of first conductive lines and an interconnect via formed of a second conductive material is formed in the via opening, wherein the formed interconnect via has a convex top surface.

10 Claims, 11 Drawing Sheets

SELF-ALIGNED CHAMFERLESS INTERCONNECT STRUCTURES OF SEMICONDUCTOR DEVICES

FIELD OF THE INVENTION

The presently disclosed subject matter relates generally to methods of fabricating semiconductor devices, and more particularly to methods of fabricating self-aligned chamferless interconnect vias of semiconductor devices and the resulting device.

BACKGROUND

One of the long-standing objectives in the advancement of integrated circuit (IC) technology is to increase device density by reducing IC dimensions. The "shrinking" of IC dimensions is critical to obtaining higher performance speed in ICs. An increase in device density requires an accompanying decrease in interconnect via and conductive line dimensions (widths) used to form interconnect structures. Fabricating these smaller dimension interconnect structures presents several challenges.

One of the challenges is ensuring precise dimension control to obtain these smaller geometries. For interconnect via fabrication at the smaller technology nodes, conventional fabrication processes are often inadequate to produce the smaller geometries with the required structural integrity. Undesirable tapered profiles forming at the top and/or sidewalls of the interconnect vias may cause unwanted deviation from electrical design specifications, thereby compromising the quality and reliability of the IC.

Conventionally, copper (Cu) metal has been used as an interconnect material. But using Cu has several technical challenges; for example, poor adherence to dielectric materials and poor recess filling properties that may result in voids being formed. Such voids may increase the resistance of the Cu interconnect structures, thereby reducing the electrical performance of ICs and the reliability of the Cu interconnect structures.

The other disadvantage of using Cu as an interconnect material is that they are highly susceptible to electro-migration. It is generally recognized that electro-migration occurs when high current passes through the IC during operation mode. Electro-migration forms voids in the Cu interconnect structures resulting from the Cu atoms being gradually displaced and sometimes forming extrusions into the surrounding dielectric material. The voids may cause the Cu interconnect structures to thin out and eventually separate completely and causing an open or broken circuit. The extrusions formed by the migrated Cu may touch an adjacent Cu line, thereby causing a short circuit. With decreasing IC and interconnect dimensions, the likelihood of Cu interconnect structures failure due to electro-migration increases, as smaller voids in the interconnect structures have greater affect.

For the reasons described above in fabricating the smaller precise dimensions of interconnect vias and in using Cu as the interconnect material, there is a strong need for self-aligned interconnect via fabrication methods that can provide interconnect vias with improved lifetime and reliability.

SUMMARY

To achieve the foregoing and other aspects of the present disclosure, methods of fabricating self-align chamferless interconnect vias of semiconductor devices and the resulting device are presented.

According to an aspect of the present disclosure, a method of fabricating interconnect structures in a semiconductor device is provided, which includes forming an interconnect layer with a plurality of conductive lines formed of a first conductive material in a dielectric layer. A via opening is formed over at least one of the plurality of conductive lines and an interconnect via formed of a second conductive material is formed in the via opening, wherein the formed interconnect via has a convex top surface.

According to another aspect of the present disclosure, a method of fabricating interconnect structures in a semiconductor device is provided, which includes forming an interconnect layer having a plurality of conductive lines formed of a first conductive material and depositing an etch stop layer and a layer of photoresist over the interconnect layer. At least one via opening is formed by selectively removing portions of the photoresist and the etch stop layer, wherein the via opening is aligned to one of the plurality of conductive lines. An interconnect via formed of a second conductive material is formed in the via opening, wherein the formed interconnect via has a convex top surface.

According to yet another aspect of the present disclosure, an interconnect structure of a semiconductor device is provided that includes an interconnect layer having a plurality of first conductive lines formed of a first conductive material, an interconnect via formed of a second conductive material and another interconnect layer having a plurality of second conductive lines formed of a third conductive material. The interconnect via has a convex top surface and is formed on a first conductive line and a second conductive line is formed on the interconnect via.

BRIEF DESCRIPTION OF THE DRAWINGS

The embodiments of the present disclosure will be better understood from a reading of the following detailed description, taken in conjunction with the accompanying drawings.

Figure 1:
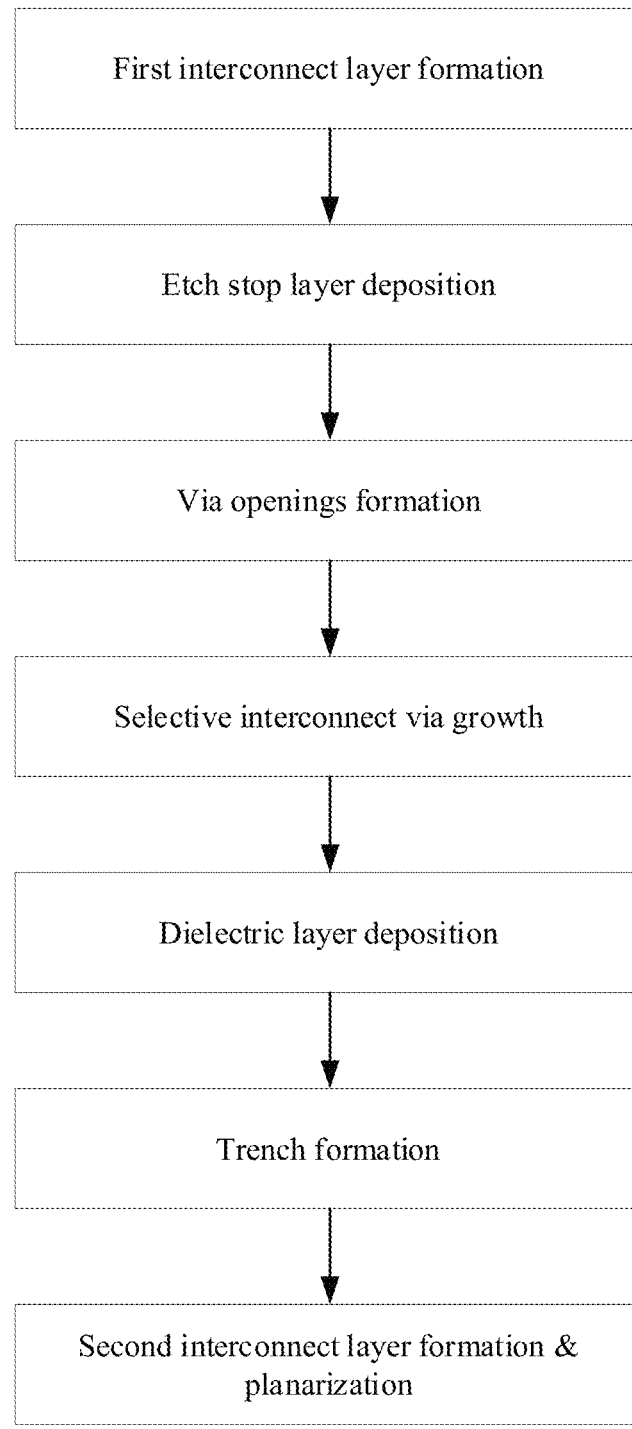
FIG. 1 is a flow chart depicting a method of fabricating interconnect structures, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. In the present disclosure, the semiconductor device has structures beneath the conductive layer that are not shown.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

The present disclosure relates to methods of fabricating interconnect structures in semiconductor devices by growing an interconnect via in a via opening in an interconnect layer. Aspects of the present disclosure are now described in detail with accompanying figures. It is noted that like and corresponding elements are referred to by like reference numerals.

As shown in FIG. 1 flow chart depicting process steps in the present method of fabricating interconnect structures, a first interconnect layer is provided, preferably a metallization layer including a plurality of first conductive lines formed of a first conductive material interposed in a dielectric material. An etch stop layer is deposited over the interconnect layer, followed by via patterning and etching of the etch stop layer to form via openings, exposing the first conductive lines. A second conductive material is selectively grown over the exposed first conductive lines, forming interconnect vias. A dielectric layer is deposited over the interconnect vias, followed by a trench patterning and etching thereof that forms a plurality of trenches over the interconnect vias. The trenches are filled with a third conductive material forming a plurality of second conductive lines in the dielectric layer. The second conductive material grown in the via openings may or may not be the same material as the first and third conductive material in the conductive lines. Description of the individual process steps will be described in further details below.

Figure 2:
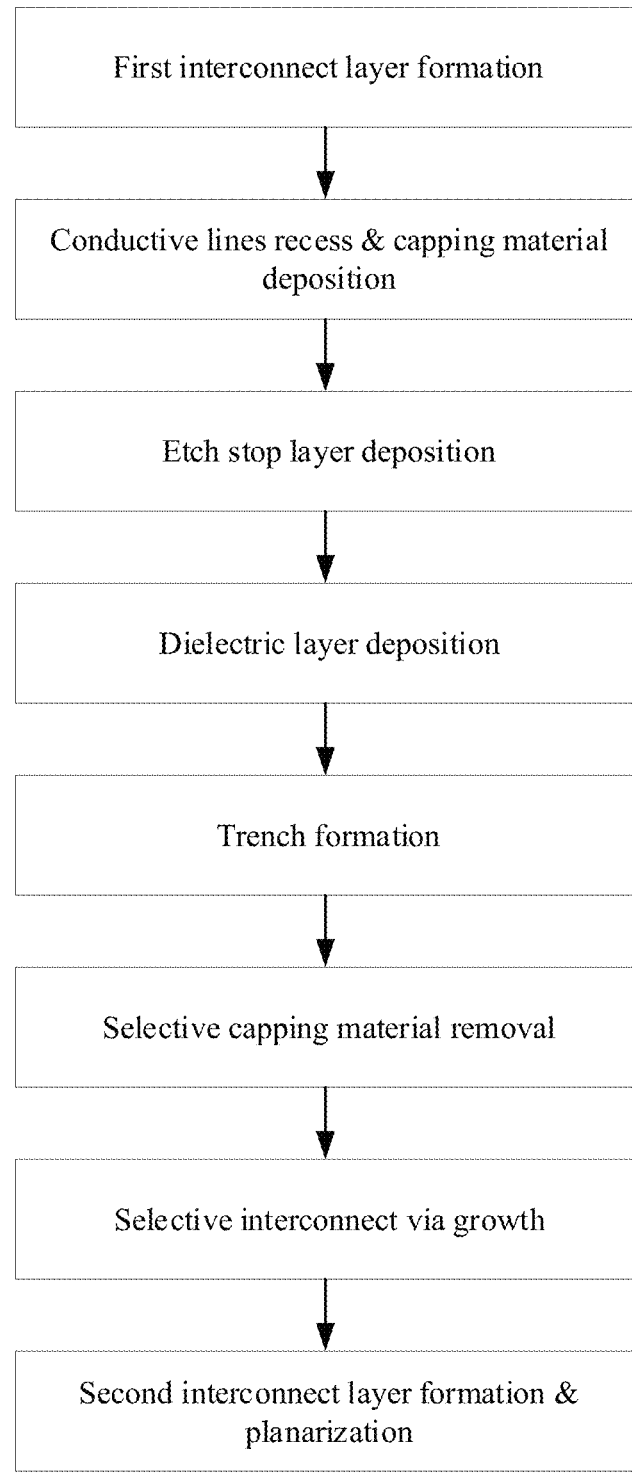
FIG. 2 is a flow chart depicting an alternative method of fabricating interconnect structures, according to an embodiment of the disclosure.

As shown in FIG. 2 flow chart depicting alternative process steps in the present method of fabricating interconnect structures, an interconnect layer is provided, preferably a metallization layer including a plurality of first conductive lines formed of a first conductive material interposed in a dielectric material. The first conductive lines are recessed, forming top spaces in the dielectric material. A capping material is deposited in the top spaces. An etch stop layer is deposited over the capping material and over the dielectric layer. Another dielectric layer is deposited over the etch stop layer and a trench is formed therein. The etch stop layer is selectively removed, exposing the capping material. The exposed capping material is removed, exposing the first conductive lines. A second conductive material is selectively grown over the exposed first conductive lines, forming interconnect vias. The trench is filled with a third conductive material, forming another interconnect layer over the interconnect vias. The second conductive material grown in the top spaces in the dielectric material may or may not be the same material as the first and third conductive material in the conductive lines. Description of the individual process steps will be described in further details below.

Figure 3:
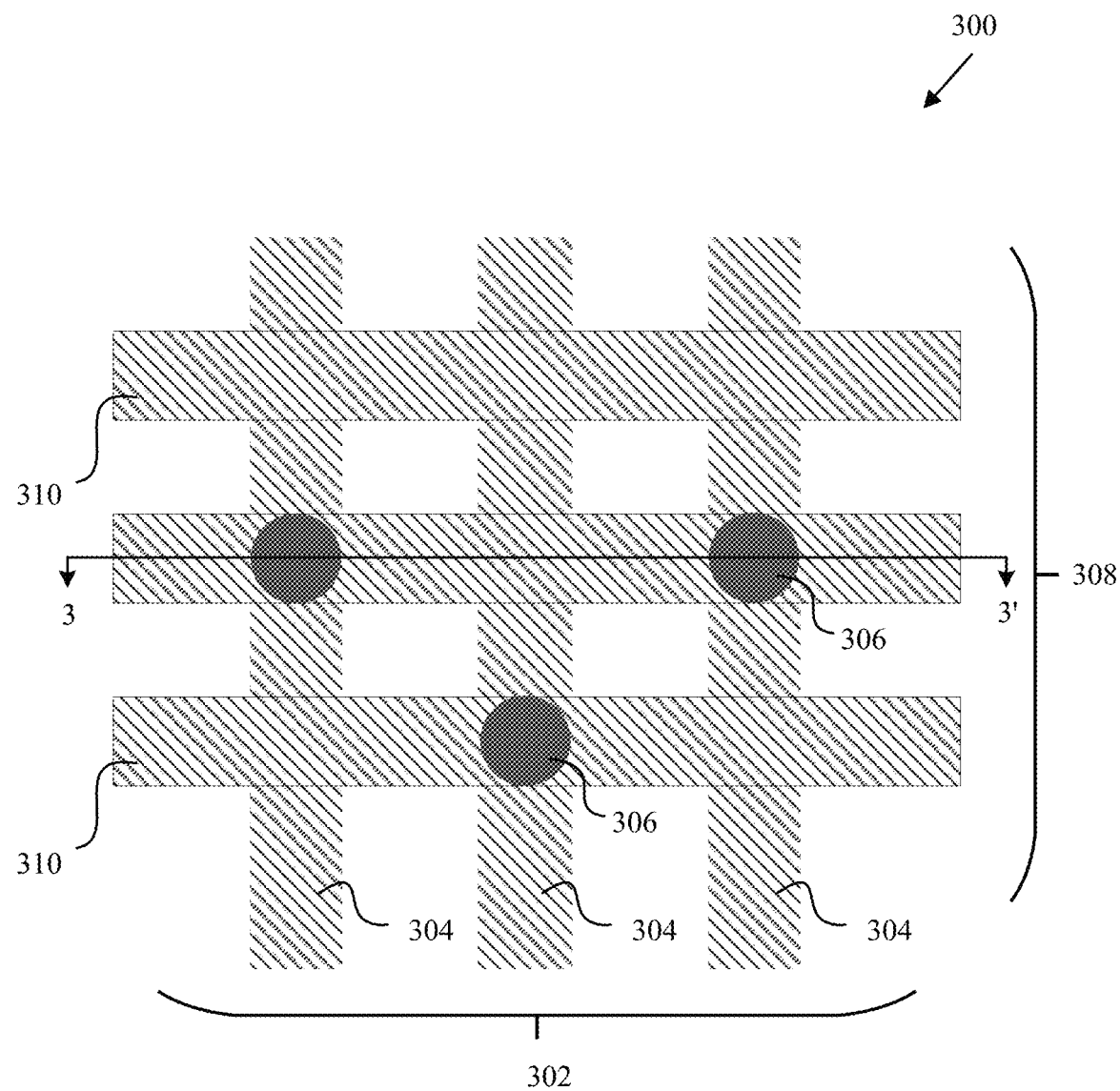
FIG. 3 is a top view of a semiconductor device, according to an embodiment of the disclosure.

FIG. 3 is a top view of a semiconductor device 300, according to an embodiment of the disclosure. More specifically, with reference to FIG. 3, the semiconductor device 300 includes a first interconnect layer 302 (i.e., an array of first conductive lines 304 formed of a first conductive material interposed in a dielectric material) at a first level, a plurality of interconnect vias 306 formed of a second conductive material and a second interconnect layer 308 (i.e., an array of second conductive lines 310 formed from a third conductive material interposed in another dielectric material) at a second level. It should be understood that the number and placements of the interconnect vias may vary according to the specific design of each semiconductor device. In this embodiment, the second interconnect layer 308 formed is perpendicular to the first interconnect layer 302. The interconnect vias 306 connect the first interconnect layer 302 to the second interconnect layer 308, and they are collectively referred to as "interconnects".

With reference to the flow chart in FIG. 1, a method of fabricating interconnect structures in a semiconductor device is presented, according to an embodiment of the disclosure. FIGS. 4A-4G are cross-sectional views of a semiconductor device 400, taken along line 3-3' as indicated in FIG. 3 of a semiconductor device 300. FIGS. 4A-4G illustrate a method of fabricating interconnect structures in semiconductor devices by growing self-aligned interconnect vias in via openings over an interconnect layer.

Figure 4A:
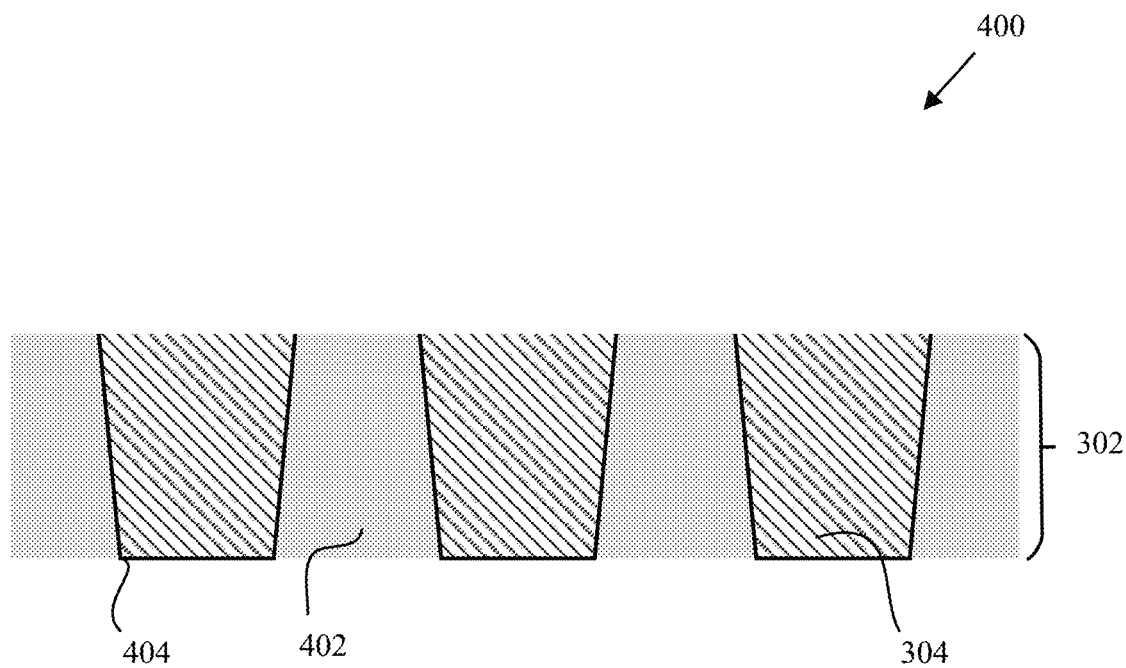
FIG. 4A-4G are cross-sectional views (taken along line 3-3' as indicated in FIG. 3) depicting a method of fabricating interconnect structures, according to an embodiment of the disclosure.

FIG. 4A illustrates a cross-sectional view of the semiconductor device 400 that includes a first interconnect layer 302 having an array of first conductive lines 304 formed of a first conductive material interposed in a first dielectric layer 402. A first diffusion barrier liner 404 is deposited between the first dielectric layer 402 and the first conductive lines 304. In one embodiment of the disclosure, the first conductive material comprises Cu and the first dielectric layer 402 comprises a dielectric material having an ultra-low dielectric constant. The first diffusion barrier liner 404 comprises tantalum (Ta), titanium (Ti), nitrides of these metals or a combination thereof (e.g., tantalum nitride/tantalum (TNT)).

Figure 4B:
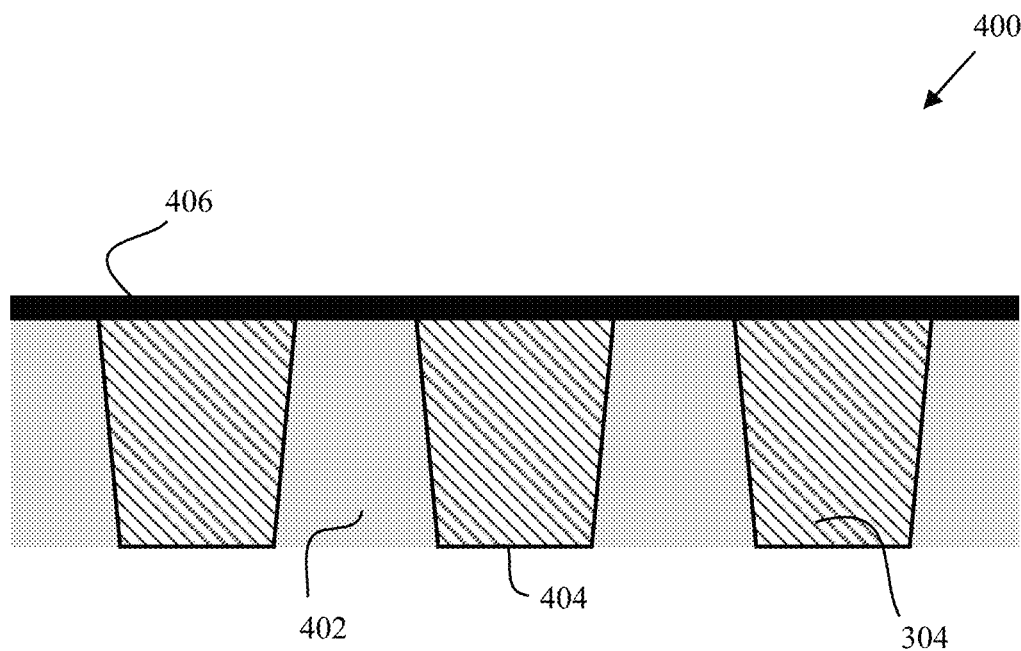

FIG. 4B illustrates the semiconductor device 400 after depositing an etch stop layer 406. The etch stop layer 406 is deposited over the first interconnect layer 302. In one embodiment of the disclosure, the etch stop layer 406 comprises silicon-rich oxynitride (SiON), silicon-rich cabonitride (SiCN) or a bi-layer of SiON and SiCN. Alternative materials for the etch stop layer 406, for example, aluminum oxide ($AlO_x$) and aluminum nitride (AlN) may also be used.

Figure 4C:
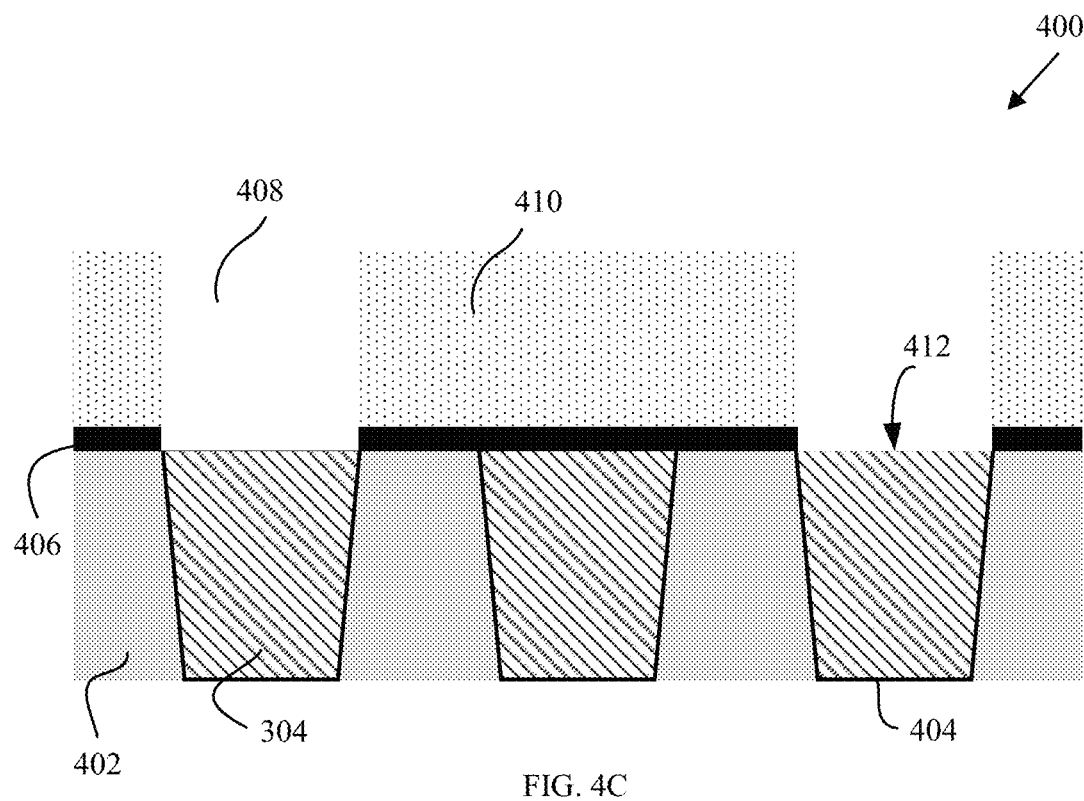

FIG. 4C illustrates the semiconductor device 400 after forming via openings 408. A layer of photoresist 410 is deposited over the etch stop layer 406. The via openings 408 are formed by removing portions of the photoresist 410 and portions of the etch stop layer 406 aligned above selected first conductive lines 304, exposing surfaces 412 of the first conductive lines 304. It should be understood that the number and placements of the via openings may vary according to the specific design of each semiconductor device. The removal of the photoresist 410 and the etch stop layer 406 may be a one-step or a two-step process.

As geometric features continue to shrink, it is preferably to identify and select alternative conductive materials that can overcome the disadvantages of Cu. The alternative materials are preferred to have lower electrical resistance and higher resistivity to electro-migration than Cu, that enables fabrication of high performance interconnects. Other preferable qualities includes having a shorter mean free length than Cu that provides a more desirable gap fill property and do not require diffusion barrier liners which are otherwise used to prevent Cu migration. In one embodiment of the disclosure, the alternative conductive materials include cobalt (Co), ruthenium (Ru) or compounds of these metals.

Figure 4D:
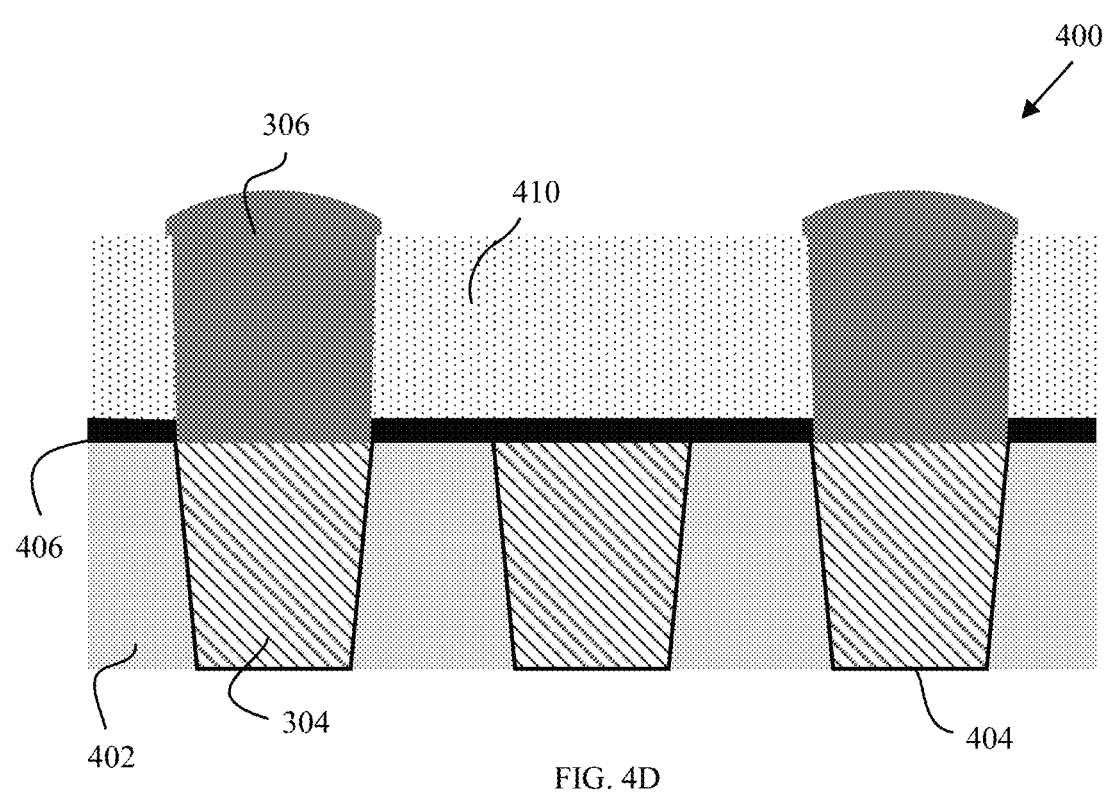

FIG. 4D illustrates the semiconductor device 400 after forming interconnect vias 306. A highly selectively chemical vapor deposition (CVD) process is used to fill the via openings 408 with a second conductive material, for example, Co. Co nucleates on the exposed surfaces 412 of the first conductive lines 304, and subsequent Co growth occurs from Co growing on Co by auto-catalytic deposition. The Co growth is confined by the via openings 408, forming self-aligned interconnect vias 306 with substantially vertical sidewalls, i.e. chamferless interconnect vias 306. When the Co growth surpasses the layer of photoresist 410, the Co growth is no longer confined by the via openings 408 and the auto-catalytic deposition of Co leads to an overfill of the via openings 408, forming convex surfaces at top portions of the interconnect vias 306. It should be appreciated that careful process control and optimization can reduce the amount of overfill by the auto-catalytic growth of Co. In one embodiment of the disclosure, the interconnect via 306 has a diameter in the range of 15 to 25 nm and has a height in the range of 15 to 30 nm, with an amount of conductive material overfill in the range of 2 to 8 nm, although wider or narrower ranges may also be employed.

Figure 4E:
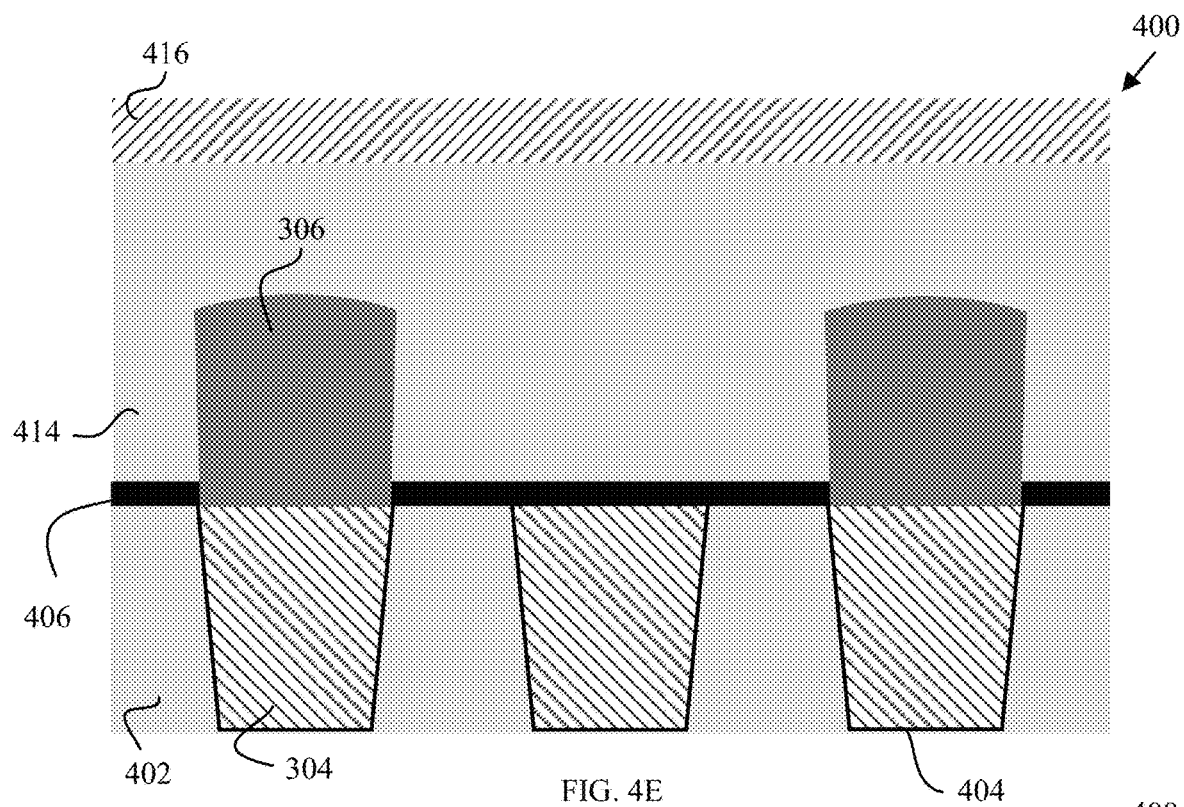

FIG. 4E illustrates the semiconductor device 400 after deposition of a second dielectric layer 414. The layer of photoresist 410 is removed, leaving behind the interconnect vias 306. There may have slight recess of the interconnect vias 306 after removal of the photoresist 410. The second dielectric layer 414 is deposited over the interconnect vias 306 and over the etch stop layer 406. A hard mask layer 416 is deposited over the second dielectric layer 414.

Figure 4F:
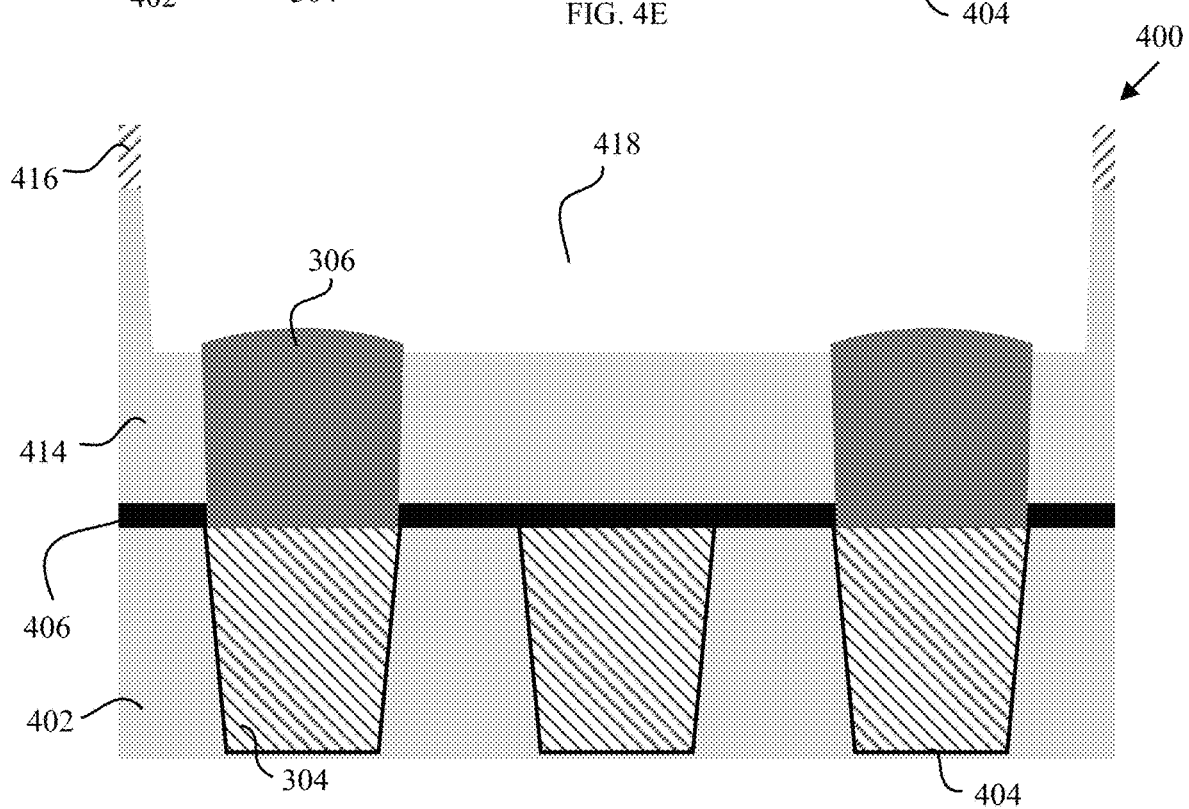

FIG. 4F illustrates the semiconductor device 400 after forming a trench 418 in the second dielectric layer 414 over the interconnect vias 306. The trench 418 is part of a pattern etched in the second dielectric layer 414 that forms the second interconnect layer 308. There may have slight recess the interconnect vias 306 after forming the trench 418. In one embodiment of the disclosure, the trench 418 formed is perpendicular to the first conductive lines 304.

Figure 4G:
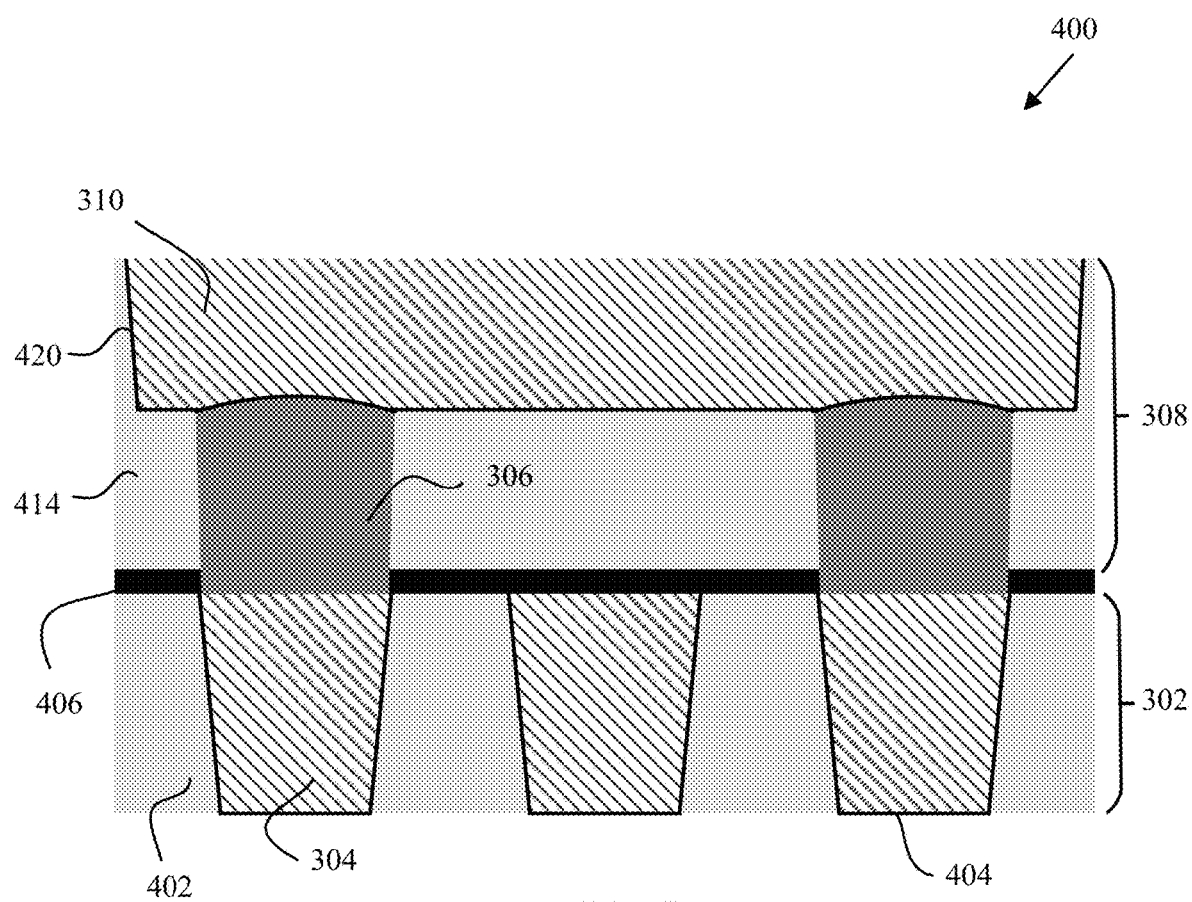

FIG. 4G illustrates the semiconductor device 400 after forming an array of second conductive lines 310 formed of a third conductive material interposed in the second dielectric layer 414. A second diffusion barrier liner 420 is deposited conformally over the trench 418, over the interconnect vias 306 and over the second dielectric layer 414. The second diffusion barrier liner 420 comprises tantalum (Ta), titanium (Ti), nitrides of these metals or a combination thereof (e.g., tantalum nitride/tantalum (TNT)), and may or may not be of the same material as the first diffusion barrier liner 404. The trench 418 is deposited with the third conductive material to form the second conductive line 310. The deposition process can be performed by physical vapor deposition (PVD), CVD, electrochemical deposition or electroless deposition. The interconnect vias 306 are electrically connected to the second conductive line 310 and together with the second dielectric layer 414, form the second interconnect layer 308.

By pre-filling the interconnect vias 306 before the trench 418, the conventional dual-damascene fill process has been converted to a single-damascene fill process, enabling reduction of the minimum conductive line width for aggressive geometric dimension shrinkage. A subsequent planarization process can be performed by a chemical mechanical planarization process (CMP). In one embodiment of the device, the third conductive material comprises Cu and the second dielectric layer 414 comprises a dielectric material having an ultra-low dielectric constant, which may or may not be of the same material as the first dielectric layer 402. The second conductive line 310 formed is coplanar with the second dielectric layer 414 after the planarization process.

With reference to the flow chart in FIG. 2, an alternative method of fabricating interconnect structures, according to another embodiment of the disclosure is presented. FIGS. 5A-5H are cross-sectional views of a semiconductor device 500, taken along line 3-3' as indicated in FIG. 3 of a semiconductor device 300. FIGS. 5A-5H illustrate a method of fabricating interconnect structures of semiconductor devices by growing self-aligned interconnect vias in via openings over an interconnect layer.

Figure 5A:
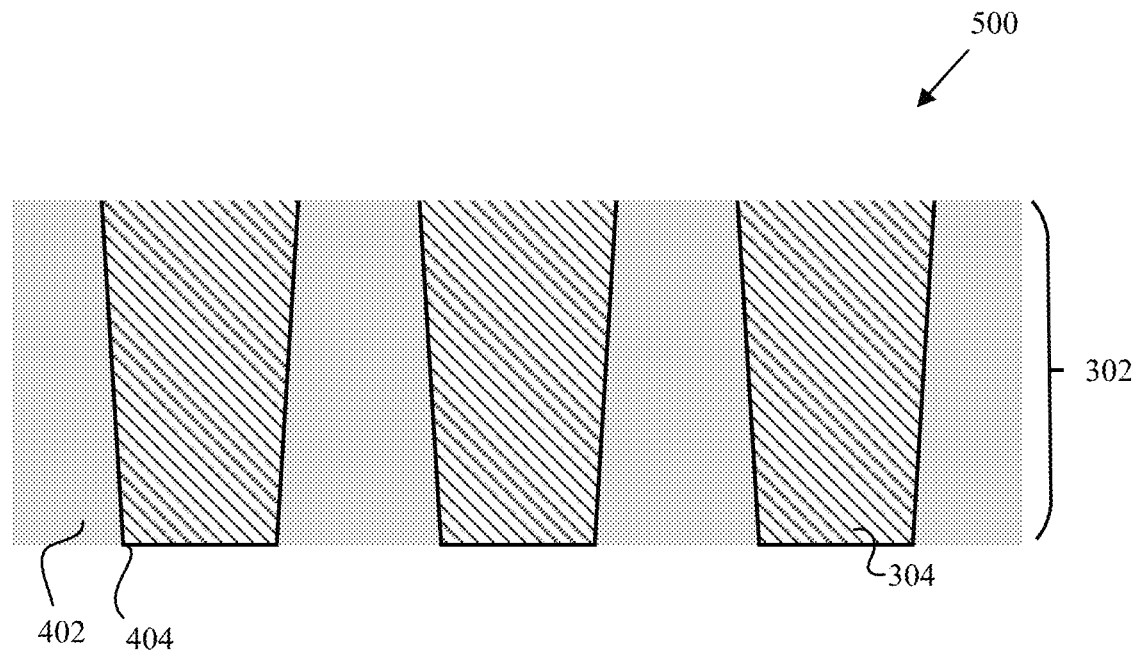
FIG. 5A-5H are cross-sectional views (taken along line 3-3' as indicated in FIG. 3) depicting an alternative method of fabricating interconnect structures, according to an embodiment of the disclosure.

FIG. 5A illustrates a cross-sectional view of the semiconductor device 500 that includes the first interconnect layer 302 having the same elements as depicted in FIG. 4A, according to an embodiment of the disclosure.

Figure 5B:
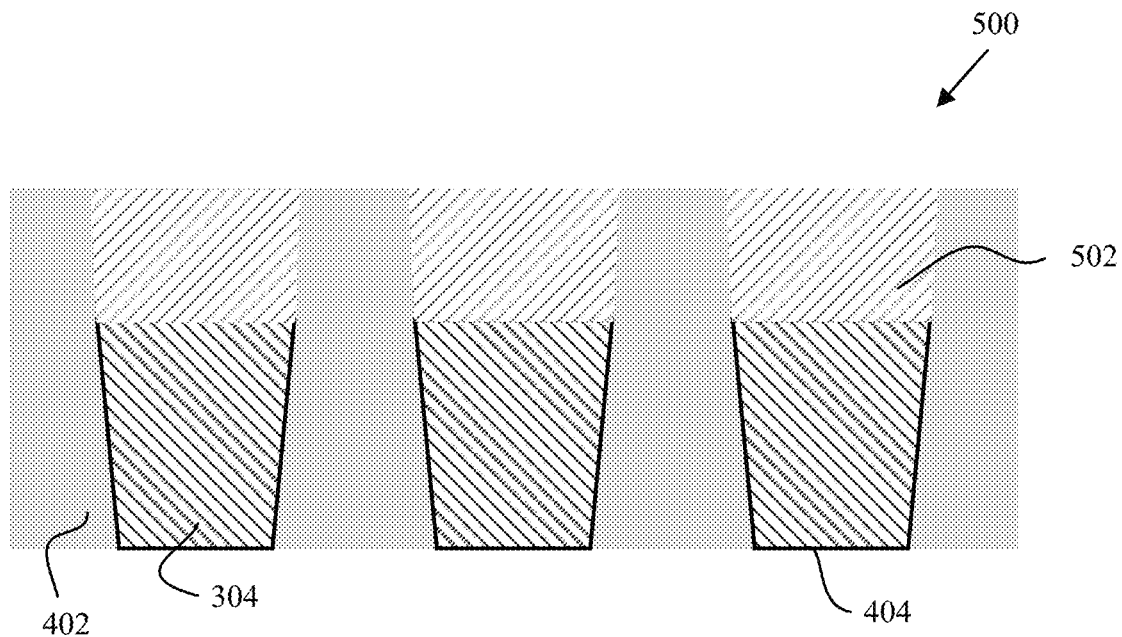

FIG. 5B illustrates the semiconductor device 500 after depositing capping material 502 in top portions of the first conductive lines 304 in the first interconnect layer 302. Top spaces 506 are formed above first conductive lines 304 by recessing the top portions of the first conductive lines 304. The deposited capping material 502 is subsequently planarized using a conventional chemical mechanical planarization (CMP) process to form a planar surface with the first dielectric layer 402. In one embodiment of the disclosure, the capping material 502 comprises silicon nitride (SiN), silicon oxycarbide (SiCO), silicon carbide (SiC) or silicon oxycarbonitride (SiOCN). The capping material 502 has a height in a range of 15-30 nm, although higher or shorter heights may also be employed.

Figure 5C:
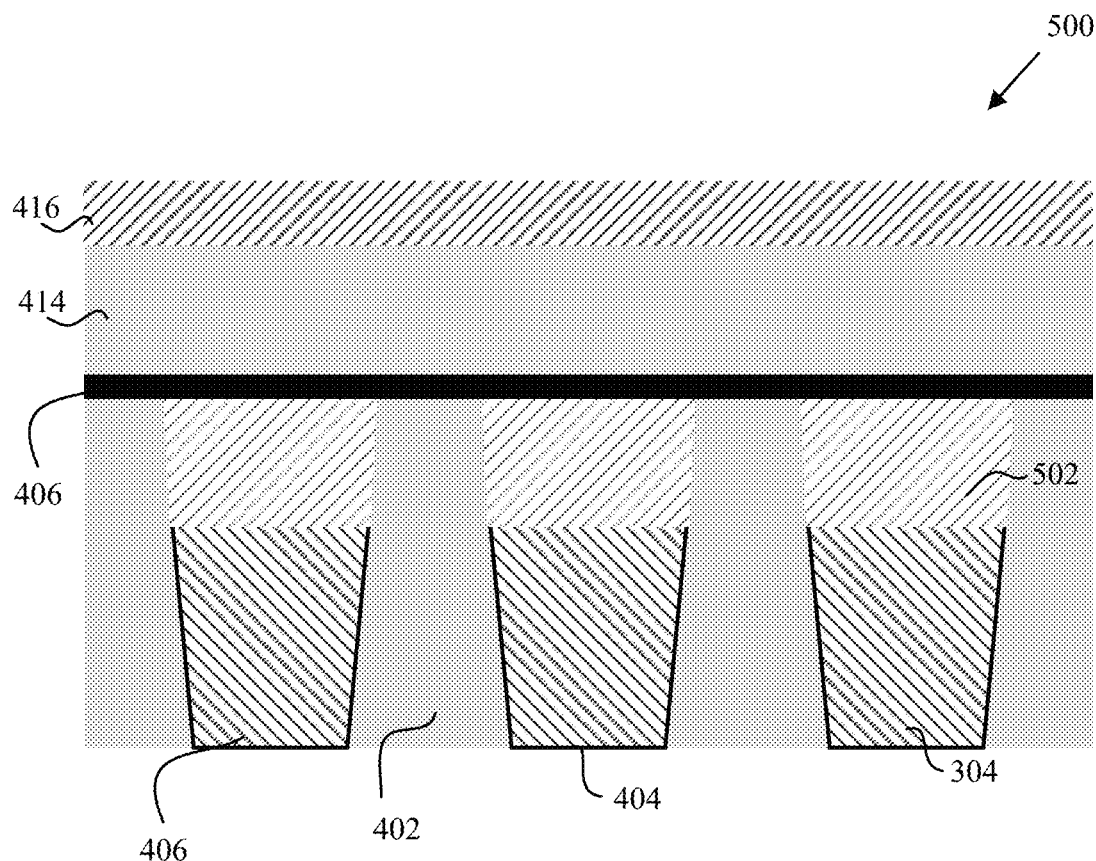

FIG. 5C illustrates the semiconductor device 500 after depositing the etch stop layer 406, the second dielectric layer 414 and the hard mask layer 416. In one embodiment of the disclosure, the etch stop layer 406 comprises silicon-rich oxynitride (SiON), silicon-rich cabonitride (SiCN) or a bi-layer of SiON and SiCN. Alternative materials for the etch stop layer 406, for example, aluminum oxide ($AlO_x$) and aluminum nitride (AlN) may also be used. The deposition of the etch stop layer 406, the second dielectric layer 414 and the hard mask layer 416 may be a one-step, a two-step or a multi-step process.

Figure 5D:
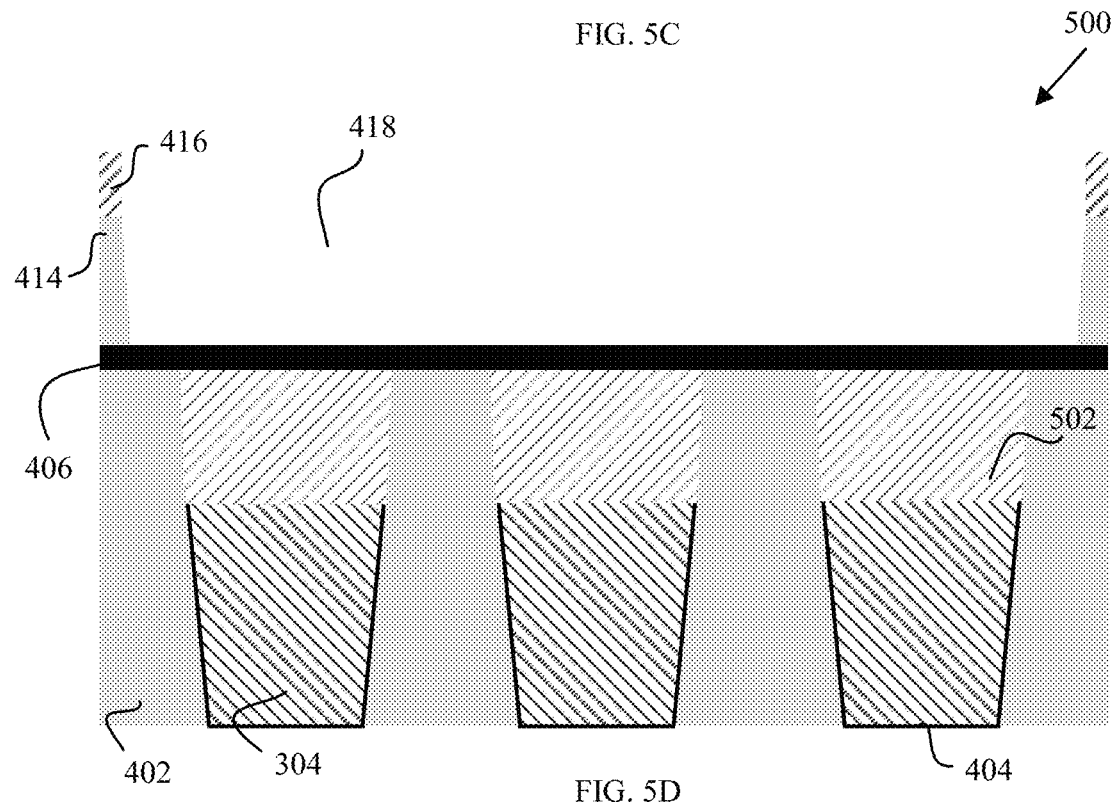

FIG. 5D illustrates the semiconductor device 500 after forming the trench 418. The hard mask layer 416 is patterned and the trench 418 is formed in the second dielectric layer 414. The trench 418 is part of a pattern etched in the second dielectric layer 414 that forms the second interconnect layer 308. A portion of the etch stop layer 406 is exposed. In one embodiment of the disclosure, the trench 418 formed is perpendicular to the first conductive lines 304.

Figure 5E:
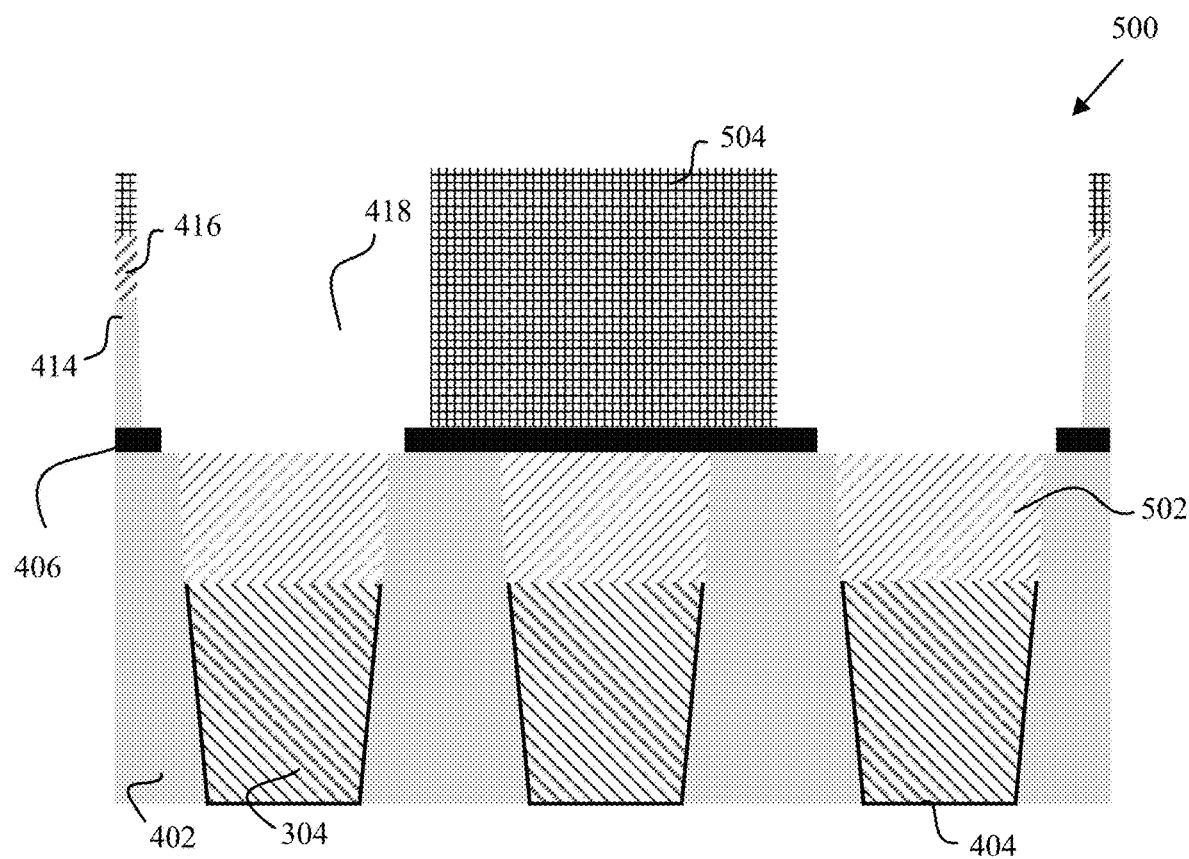

FIG. 5E illustrates the semiconductor device 500 after selectively removing portions of the exposed etch stop layer 406. An optical planarization layer (OPL) 504 is deposited in the trench 418 and patterned to define the portions of the etch stop layer 406 to be removed, which is determined by the placements of the interconnect vias 306, according to specific design of each semiconductor device. The portions of the etch stop layer 406 to be removed are aligned to the first conductive lines 304. The capping material 502 is exposed after the selective removal of the etch stop layer 406. The etch stop layer 406 removed is wider than the first conductive line 304 to ensure that the subsequent process steps of fabricating the interconnect vias 306 will form a fully aligned interconnect via to an above interconnect layer.

Figure 5F:
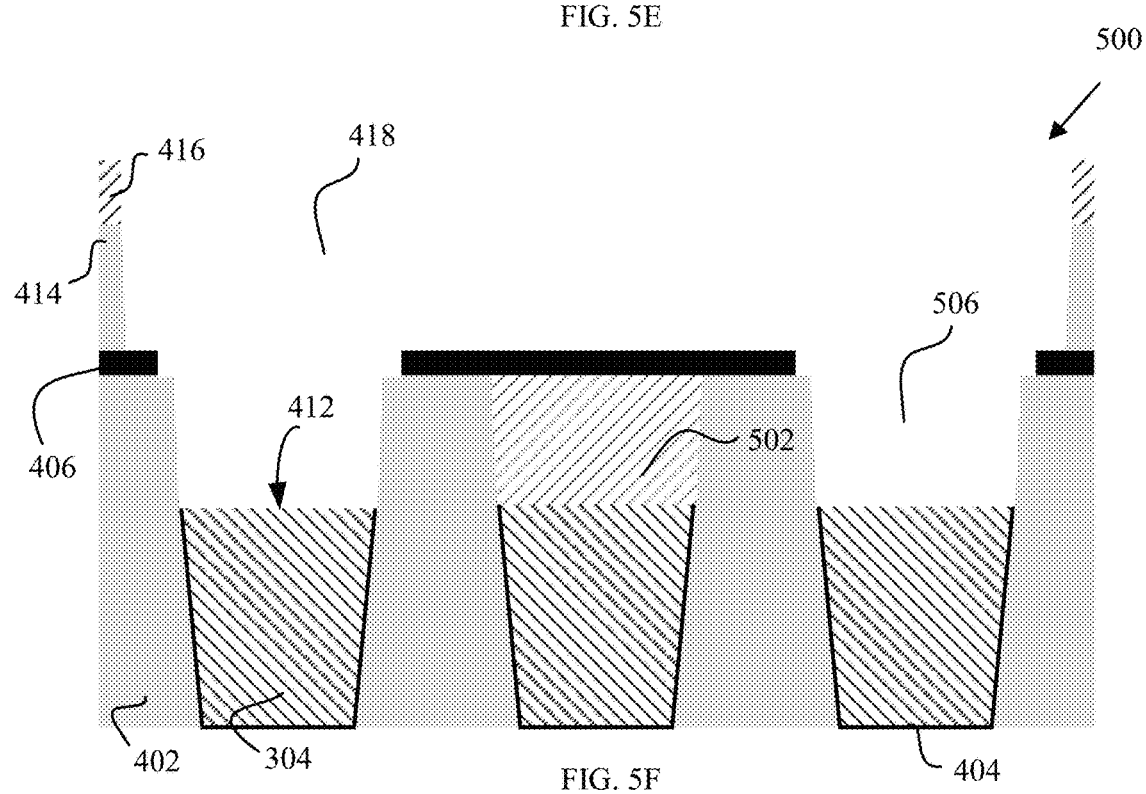

FIG. 5F illustrates the semiconductor device 500 after selectively removing the capping material 502, forming the top spaces 506 over the first conductive lines 304. The top spaces 506 expose surfaces 412 of the first conductive lines 304. The OPL 504 is also subsequently removed. The removal of the capping material and the OPL may be a one-step or a two-step process.

Figure 5G:
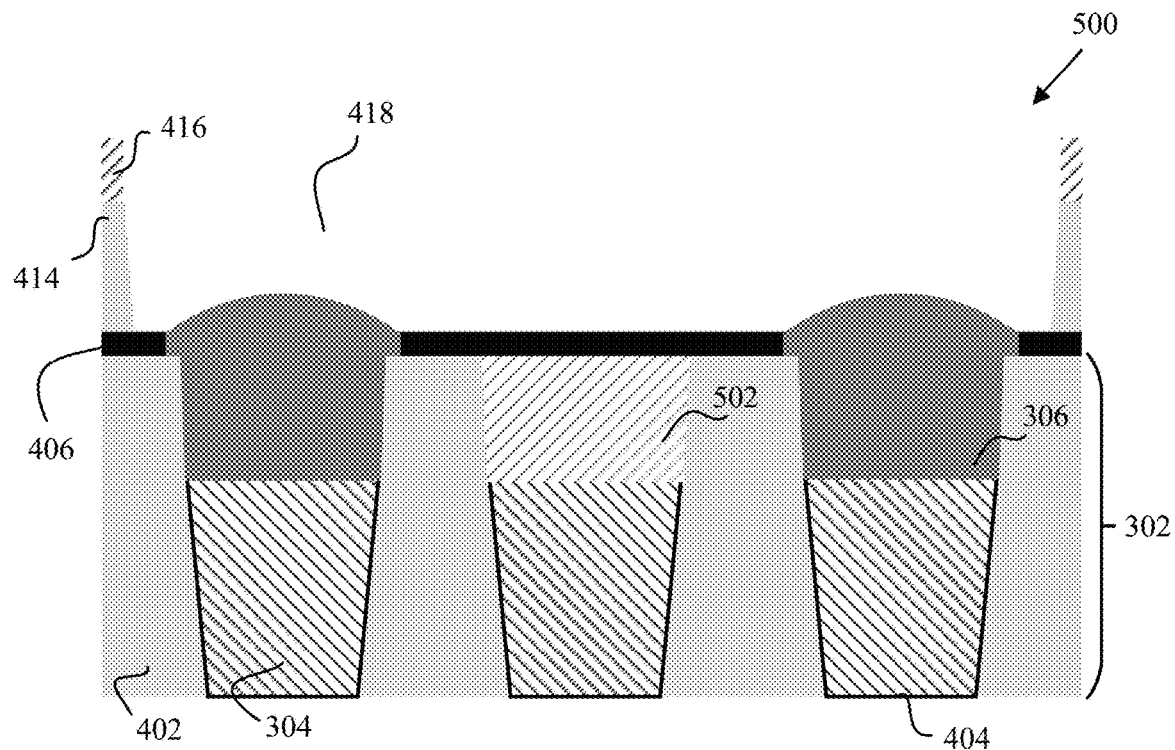

FIG. 5G illustrates the semiconductor device 500 after forming the interconnect vias 306 in top spaces 506 over the first conductive lines 304. The material and process used to form the interconnect vias 306 have been described in FIG. 4D. The interconnect vias 306 are formed in the first interconnect layer 302 and having convex surfaces at top portions of the interconnect vias 306 extending into the trench 418.

Figure 5H:
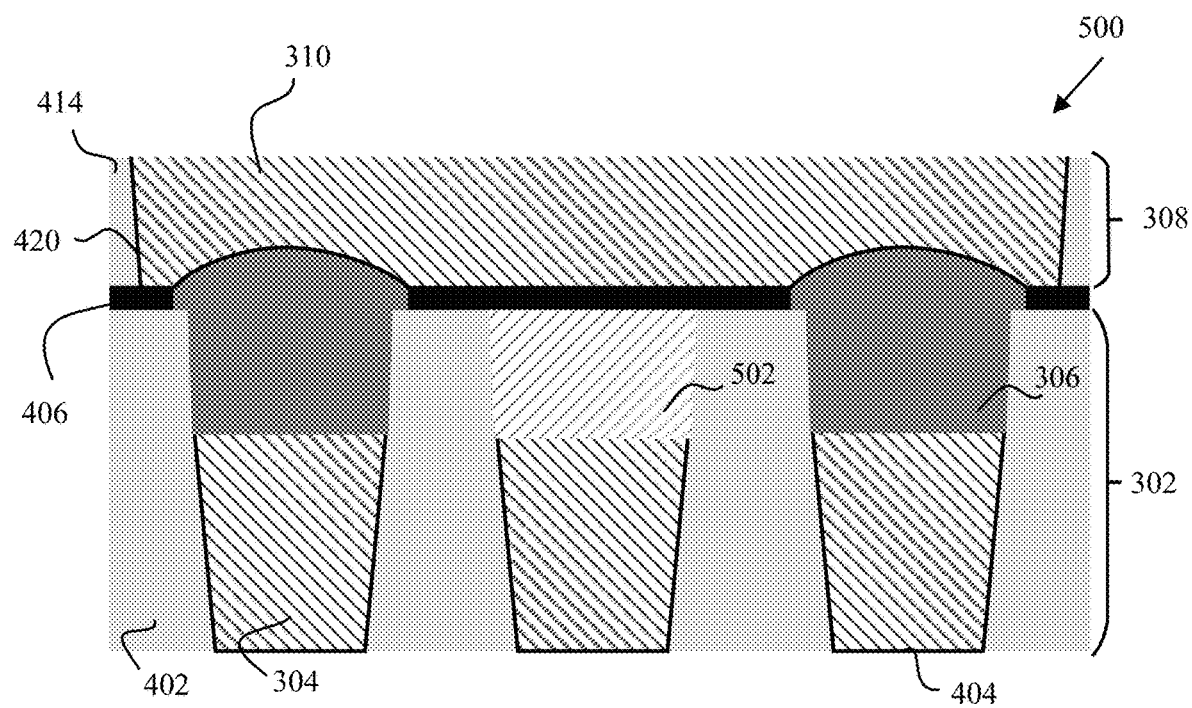

FIG. 5H illustrates the semiconductor device 500 after forming the second interconnect layer 308 including an array of second conductive lines 310 formed of a third conductive material interposed in the second dielectric layer 414, which has been described in detail in FIG. 4G. The interconnect vias 306 are electrically connected to the second conductive line 310.

As presented in the above detailed description, methods of fabricating self-align chamferless interconnect via structures of semiconductor device are presented. By using the disclosed methods, the interconnect vias are formed in a confined opening, i.e., a via opening in a layer of photoresist or a top space above a conductive line. The confined opening provides the required structural integrity for the fabrication of a chamferless interconnect via. The interconnect via is filled with an alternative conductive material that has several advantages over the conventionally used interconnect material Cu. Co, Ru or compounds of these metals have lower electrical resistance and a shorter mean free length than Cu, thus providing a better gap fill property. By using one of the above-mentioned conductive materials as the interconnect material also eliminates the use of diffusion barrier liners due to their resistance to electro-migration, and will help to meet the scaling down objective in the advancement of IC development.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. An interconnect structure of a semiconductor device comprising:
   a first interconnect layer in a first dielectric layer, wherein the first interconnect layer is formed of a first conductive material;
   an interconnect via having sidewalls in a second dielectric layer over the first interconnect layer, wherein the interconnect via is formed of a second conductive material and has a convex top surface; and
   a second interconnect layer in the second dielectric layer, wherein the second interconnect layer is formed of a third conductive material, wherein the first and the third conductive materials are the same material.

2. The device of claim 1 wherein the sidewalls are chamferless sidewalls.

3. The device of claim 1 wherein the interconnect via has a width in a range of 15 to 25 nm.

4. The device of claim 1 wherein the interconnect via has a height in a range of 15 to 30 nm.

5. The device of claim 1 wherein the second conductive material comprises Co.

6. The device of claim 1 wherein the second conductive material comprises Ru.

7. An interconnect structure of a semiconductor device comprising:
   a first interconnect layer in a first dielectric layer, wherein the first interconnect layer is formed of a first conductive material;
   an interconnect via in the first dielectric layer, wherein the interconnect via is formed of a second conductive material and has a convex top surface; and
   a second interconnect layer in a second dielectric layer over the first dielectric layer, wherein the second interconnect layer is formed of the first conductive material and is electrically connected to the first interconnect layer by the interconnect via.

8. The device of claim 7, wherein the convex top surface of the interconnect via extends into the second interconnect layer.

9. The device of claim 7, wherein the first interconnect layer comprises a plurality of first conductive lines and the second interconnect layer comprises a plurality of second conductive lines, the plurality of second conductive lines is arranged perpendicular over the plurality of first conductive lines.

10. The device of claim 9, wherein the plurality of the first conductive lines has a height less than a height of the first dielectric layer.

* * * * *